US012635112B2

(12) United States Patent
Ide et al.

(10) Patent No.: US 12,635,112 B2
(45) Date of Patent: May 19, 2026

(54) HEAT SINK STRUCTURE

(71) Applicant: Lotus Thermal Solution Inc., Osaka (JP)

(72) Inventors: Takuya Ide, Osaka (JP); Masaaki Murakami, Osaka (JP); Tomiyuki Numata, Osaka (JP)

(73) Assignee: LOTUS THERMAL SOLUTION INC., Osaka (JP)

( * ) Notice: Subject to any disclaimer, the term of this patent is extended or adjusted under 35 U.S.C. 154(b) by 0 days.

(21) Appl. No.: 18/290,231

(22) PCT Filed: May 6, 2022

(86) PCT No.: PCT/JP2022/019594
§ 371 (c)(1),
(2) Date: Nov. 10, 2023

(87) PCT Pub. No.: WO2022/244628
PCT Pub. Date: Nov. 24, 2022

(65) Prior Publication Data
US 2024/0237290 A1 Jul. 11, 2024

(30) Foreign Application Priority Data

May 20, 2021 (JP) ................................. 2021-085286

(51) Int. Cl.
*H05K 7/20* (2006.01)
*G06F 1/20* (2006.01)
(52) U.S. Cl.
CPC ........... *H05K 7/2039* (2013.01); *G06F 1/206* (2013.01)
(58) Field of Classification Search
CPC .. H05K 7/2039; H05K 7/20409; G06F 1/206; F28F 2215/08; F28F 2215/04; F28F 2215/00; F28F 13/12
(Continued)

(56) References Cited

U.S. PATENT DOCUMENTS 5,538,700 A * 7/1996 Koves ................... F28D 9/0031
422/198
5,625,229 A * 4/1997 Kojima ................... F28F 3/025
257/722
(Continued)

FOREIGN PATENT DOCUMENTS

CN 111829362 A 10/2020
JP H08-320194 A 12/1996
(Continued)

OTHER PUBLICATIONS

Office Action of Japanese Patent Application No. 2021-085286: Notice of Reasons for Refusal issued Feb. 6, 2024 (8 sheets, 6 sheets translation, 14 sheets total).
(Continued)

*Primary Examiner* — Claire E Rojohn, III
(74) *Attorney, Agent, or Firm* — Kratz, Quintos & Hanson, LLP

(57) ABSTRACT

A heat sink structure includes: a corrugated fin that is made of metal, and has a cross section in a wave form and a plate surface in which a plurality of through holes are opened; heat absorbing portions and that absorb heat from a cooling target object and transmit the heat to the corrugated fin; and a fluid flow path that allows cooling fluid to be supplied toward the plate surface of the corrugated fin and allows the cooling fluid to flow along the through holes. The heat transmitted from the heat absorbing portions and to the corrugated fin is radiated in the cooling fluid passing through the through holes.

3 Claims, 5 Drawing Sheets

(58) Field of Classification Search
USPC ........................................................ 165/80.3
See application file for complete search history.

(56)                    References Cited

U.S. PATENT DOCUMENTS

|  |  |  |  |  |
|---|---|---|---|---|
| 6,749,817 | B1 * | 6/2004 | Mulvaney, III .......... | B01J 19/32 422/615 |
| 6,901,995 | B2 * | 6/2005 | Yamaguchi .......... | B21D 31/046 165/173 |
| 7,117,928 | B2 * | 10/2006 | Chen ......................... | F28F 3/04 165/104.34 |
| 7,284,596 | B2 * | 10/2007 | Larson ................ | H01L 21/4878 257/E23.103 |
| 7,548,428 | B2 * | 6/2009 | Lev ......................... | G06F 1/203 174/16.3 |
| 7,614,443 | B2 * | 11/2009 | Usui ....................... | F28F 3/025 165/177 |
| 8,359,745 | B2 * | 1/2013 | Lin ...................... | F28D 15/0266 29/890.038 |
| 8,418,752 | B2 * | 4/2013 | Otahal ................... | B21D 53/02 165/166 |
| 9,453,685 | B2 * | 9/2016 | Miao ....................... | F28F 3/027 |
| 9,689,628 | B2 * | 6/2017 | Uno ....................... | F28D 9/0043 |
| 9,945,619 | B2 * | 4/2018 | Cho ........................ | F28F 3/025 |
| 10,145,624 | B2 * | 12/2018 | Rhee ...................... | F28F 3/025 |
| 10,220,431 | B2 * | 3/2019 | Mitsukawa ............ | B21D 13/08 |
| 11,032,944 | B2 * | 6/2021 | Gwin ................. | H05K 7/20509 |
| 11,454,448 | B2 * | 9/2022 | Fukada ................... | F28F 3/027 |
| 11,920,517 | B2 * | 3/2024 | Wiedenhoefer ......... | F02C 7/185 |

|  |  |  |  |  |
|---|---|---|---|---|
| 2008/0283234 | A1 * | 11/2008 | Sagi ...................... | H01L 23/427 165/182 |
| 2010/0139904 | A1 * | 6/2010 | Chiba ................. | H01L 23/3733 165/104.11 |
| 2014/0311712 | A1 * | 10/2014 | Huang ...................... | F28F 1/10 165/185 |
| 2017/0341483 | A1 * | 11/2017 | Hirasawa .......... | H01M 10/6552 |
| 2020/0232663 | A1 * | 7/2020 | Buff ...................... | F24F 13/222 |
| 2022/0325956 | A1 | 10/2022 | Jiang |  |
| 2024/0118040 | A1 * | 4/2024 | Nakamura ................ | F28F 1/16 |
| 2024/0237290 | A1 * | 7/2024 | Ide ...................... | F28D 15/0275 |
| 2024/0251525 | A1 * | 7/2024 | Ide ........................ | H05K 7/2029 |
| 2025/0164192 | A1 * | 5/2025 | Shimmura ............. | B21D 53/08 |

FOREIGN PATENT DOCUMENTS

| JP | 2001-358270 | A | 12/2001 |
|---|---|---|---|
| JP | 2005-228948 | A | 8/2005 |
| JP | 3175160 | U | 4/2012 |
| WO | 2007/017945 | A1 | 2/2007 |
| WO | 2020/235217 | A1 | 11/2020 |

OTHER PUBLICATIONS

International Search Report for International Application No. PCT/JP2022/019594 dated Jul. 26, 2022 (2 sheets, 2 sheets translation). Office Action of corresponding Chinese Patent Application No. 202280035789.7 issued Mar. 21, 2026 (9 sheets, 6 sheets translation, 15 sheets total).

* cited by examiner

HEAT SINK STRUCTURE

TECHNICAL FIELD

The present invention relates to a heat sink structure suitably used for cooling a heat generating element composed of an electronic circuit device that generates a large amount of heat, such as a central processing unit (CPU) and a chipset in a computer.

BACKGROUND ART

Conventionally, a heat sink structure of this type has been proposed which includes a base on which the heat generating element is placed, and a plurality of plate-shaped fins supported on the base in parallel with a space therebetween. In such a structure, each fin has a large number of through holes extending in a thickness direction (alignment direction), cooling fluid flows in a direction along which the plate-shaped fins are aligned, and heat is radiated into the cooling fluid as it passes through the through holes of each fin in sequence (see Patent Literatures (PTLs) 1 and 2, for example).

According to the heat sink structure configured to allow the cooling fluid such as air to flow through the plate-shaped fins each having many through holes, heat transmission performance according to a contact area between the cooling fluid and the through holes can be obtained. Specifically, in the heat sink structure as described above, the smaller the diameter of each of the through holes is and the larger the number of the through holes is, the better cooling performance tends to be obtained.

However, if a hole diameter of the through hole becomes small, flow resistance of the cooling fluid passing through the through hole increases, and pressure loss inevitably increases. If the pressure loss increases, a flow rate of the fluid becomes insufficient in a low-power fan with a low noise level, for example. Although a powerful fan may be used to ensure a required flow rate, power consumption and noise for driving the fan increase, and a facility cost increases.

In addition, in order to increase the contact area of the through holes with the cooling fluid without extremely reducing the hole diameters of the through holes provided in each of the plate-shaped fins, it is also conceivable to increase a width dimension (installation height) of the plate-shaped fin installed on the base of the heat sink structure. However, this prevents the heat sink from being provided in a place where a space is restricted, and a range of application is restricted. Furthermore, it is difficult to transmit the heat from the heat generating element to a tip of the plate-shaped fin. Accordingly, the cooling performance cannot be sufficiently improved.

CITATION LIST

Patent Literature

PTL 1: Japanese Unexamined Patent Application Publication No. 2001-358270
PTL 2: Japanese Unexamined Patent Application Publication No. 2005-228948

SUMMARY OF INVENTION

Technical Problem

In view of the situation described above, a purpose of the present invention is to provide a heat sink structure capable of improving the cooling performance while restraining the pressure loss of the cooling fluid even when a flow path area is restricted.

Solution to Problem

Specifically, the present invention includes the following inventions.

(1) A heat sink structure including: a corrugated fin that is made of metal, and has a cross section in a wave form and a plate surface in which a plurality of through holes are opened; a heat absorbing portion that absorbs heat from a cooling target object and transmits the heat to the corrugated fin; and a fluid flow path that allows cooling fluid to be supplied toward the plate surface of the corrugated fin and allows the cooling fluid to flow along the through holes, in which the heat transmitted from the heat absorbing portion to the corrugated fin is radiated into the cooling fluid passing through the through holes.

(2) The heat sink structure according to the above (1), in which the corrugated fin is formed by a continuous body of a mountain-shaped portion with a semicircular cross section and a valley-shaped portion with a semicircular cross section.

(3) The heat sink structure according to the above (1) or (2), in which the heat absorbing portion is a heat pipe, each of the mountain-shaped portion and the valley-shaped portion has a radius of curvature corresponding to the heat pipe, and the heat pipe is joined along an inner peripheral surface of at least one of the mountain-shaped portion and the valley-shaped portion.

(4) The heat sink structure according to any one of the above (1) to (3), in which the through holes extend in a thickness direction of the corrugated fin.

(5) The heat sink structure according to any one of the above (1) to (4), in which a plurality of corrugated fins, each being the corrugated fin, are arranged at an interval with plate surfaces of the respective corrugated fins facing each other, and the cooling fluid is sequentially supplied toward the plate surface of each of the corrugated fins.

(6) The heat sink structure according to any one of the above (1) to (5), in which the corrugated fin is a bent product of a cut piece of a lotus-type porous metal molded body molded through a metal solidification method, the lotus-type porous metal molded body having a plurality of pores that extend in one direction.

Advantageous Effects of Invention

In the heat sink structure according to the present invention, a cross section of each corrugated fin having through holes for heat radiation is formed in a wave shape. Accordingly, a total perimeter of the corrugated fin is longer than that of a plate-shaped fin, per the same cross-sectional area of a flow path, thereby increasing a contact area of the corrugated fins with the cooling fluid as compared to the plate-shaped fin. As the contact area of the corrugated fins with the cooling fluid increases, the number of through holes also increases. With this configuration, a high cooling effect can be obtained, and at the same time a flow velocity of the fluid passing through each through hole can be prevented from increasing, making it possible to restrain the pressure loss of the fluid. Therefore, the cooling performance of the heat sink can be sufficiently improved without providing a powerful fan in a fluid flow path, and increase in power consumption and noise generation can also be avoided.

In a case where the corrugated fin is formed by a continuous body of a mountain-shaped portion having a semicircular cross section and a valley-shaped portion having a semicircular cross section, the contact area of the corrugated fin with the cooling fluid can be expanded by approximately 57%, compared to the plate-shaped fin. Accordingly, better heat exchange capability can be obtained with a simple configuration.

The heat absorbing portion is a heat pipe. The mountain-shaped portion and the valley-shaped portion have a radius of curvature corresponding to the heat pipe. The heat pipe may be joined along an inner peripheral surface of at least one of the mountain-shaped portion and the valley-shaped portion. In such a structure, the heat pipe and the corrugated fin can be satisfactorily joined, and an area of the heat transmission from the heat pipe to the corrugated fin can be effectively enlarged.

In a structure in which the through holes extend in the thickness direction of the corrugated fins, the flow resistance can be reduced when the cooling fluid passes through the through holes. Accordingly, heat can be efficiently radiated while restraining the pressure loss. Therefore, the cooling performance of the heat sink can be further improved.

A plurality of corrugated fins may be arranged at intervals with plate surfaces of the corrugated fins facing each other, and the fluid may be sequentially supplied toward the plate surface of each corrugated fin. In such a structure, the cooling performance of the heat sink can be sufficiently ensured without taking measures such as increasing installation height of the corrugated fins. Therefore, the heat sink can be installed even in a place where a space is small, and the heat sink structure can be made thinner and more compact than the conventional heat sink structure.

A structure in which the corrugated fin is formed by a bent product made from a cut piece of a lotus-type porous metal molded body that has been molded through a metal solidification method and has a plurality of pores that extend in one direction can be manufactured easily at a lower cost, compared to a structure obtained through machining each through hole of the corrugated fin through drilling or the like. Furthermore, a lotus metal is used to allow a contact area with the cooling fluid to be doubled. Accordingly, in addition to achievement of higher heat exchange capacity, it is possible to provide a low-noise heat sink while restraining pressure loss in the cooling fluid.

DESCRIPTION OF EMBODIMENTS

Figure 1:
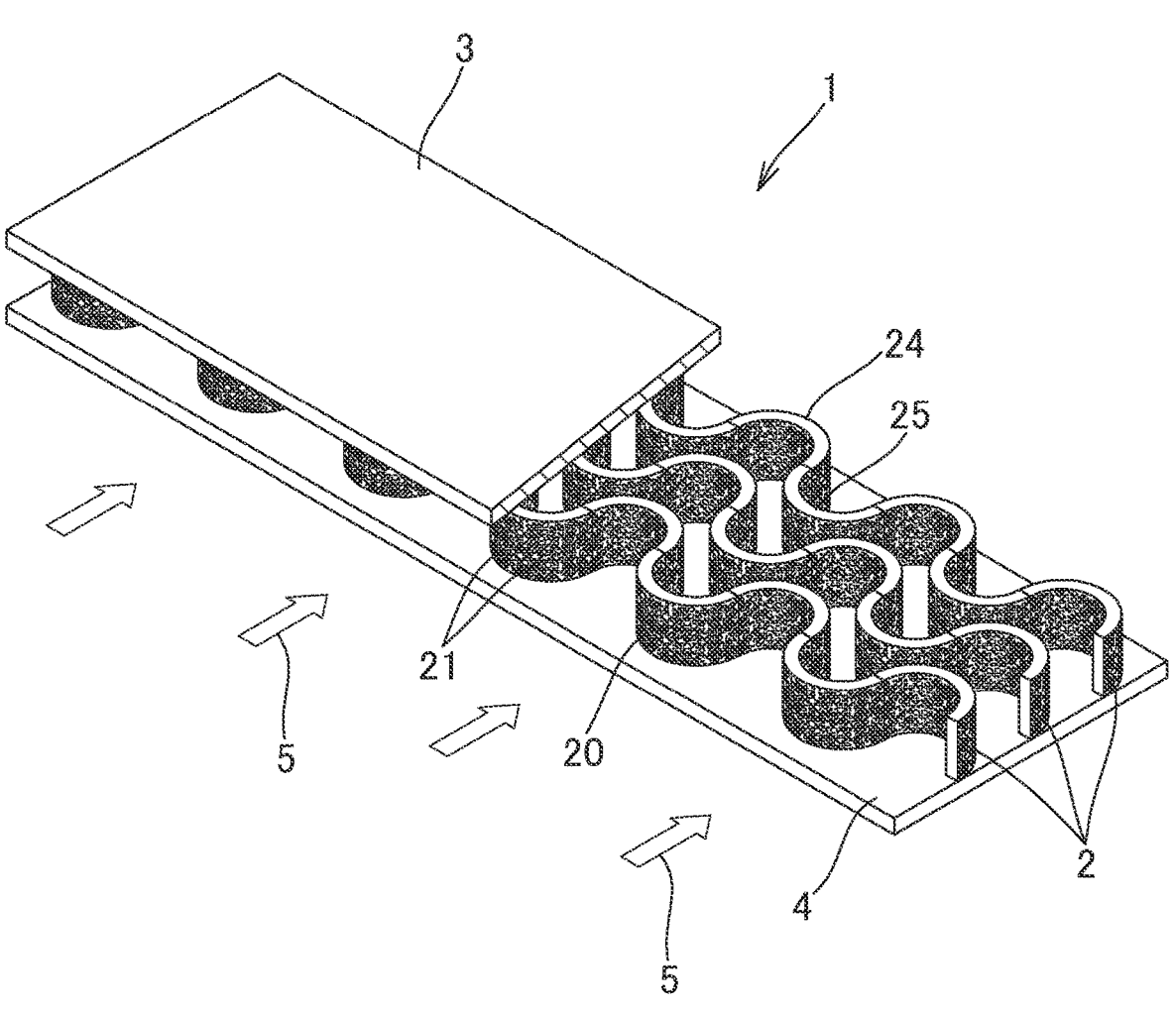
FIG. 1 is a perspective view showing a main part of a heat sink structure according to a typical embodiment of the present invention.

A heat sink structure according to a typical embodiment of the present invention will be described with reference to FIGS. 1 to 3. A heat sink structure 1 according to the typical embodiment of the present invention has a cross section that is formed into a wave shape using a metal material such as aluminum, iron, and copper. The heat sink structure 1 includes: a corrugated fin 2 having a plate surface 20 in which a plurality of through holes 21 are opened; a pair of upper and lower heat absorbing portions 3 and 4 that absorb heat from a cooling target object and transmit the heat to the corrugated fin 2; and a fluid flow path 5 that allows cooling fluid to be supplied toward the plate surface 20 of the corrugated fin 2 and allows the fluid to flow along the through holes 21.

The heat absorbing portions 3 and 4 are each formed into a rectangular plate shape using, for example, a metal material such as aluminum, iron, and copper. Then, a cooling target object (not shown) such as a CPU on a computer board is placed in close contact with an upper surface of the heat absorbing portion 3, and heat from the cooling target object is transmitted to and absorbed by the heat absorbing portion 3. At this time, it is preferable to appropriately interpose known grease with excellent thermal conductivity (so-called CPU grease) between the heat absorbing portion 3 and the cooling target object. It should be noted that the shape of the heat absorbing portions 3 and 4 is not limited to the rectangular plate shape, and one of the heat absorbing portions 3 and 4 may be omitted. Alternatively, the heat absorbing portions 3 and 4 may be plate-shaped radiation fins of a conventional heat sink, and the corrugated fin 2 may be provided between these radiation fins. The cooling target object in the present invention is not limited to the CPU, but may also be a chipset, which is an electronic circuit device that generates a large amount of heat, or other heat generating elements.

Between the heat absorbing portions 3 and 4, a plurality of corrugated fins 2 are provided in parallel to each other at a constant interval, with their plate surfaces facing each other. The upper and lower ends of each corrugated fin 2 are integrally joined to the heat absorbing portions 3 and 4 by brazing or the like. Furthermore, fluid such as air is blown between the heat absorbing portions 3 and 4 by an unillustrated blower fan or the like provided in the fluid flow path 5, and is sequentially supplied toward the plate surface 20 of each corrugated fin 2. With this configuration, the cooling fluid flows along the through holes 21 of each corrugated fin 2, and the heat transmitted to the corrugated fins 2 is radiated into the fluid.

Each of the corrugated fins 2 is formed using a plate-shaped material 2a (see FIG. 2) obtained by cutting a lotus-type porous metal molded body that has been molded through a metal solidification method and has a large number of pores that extend in one direction, in a direction intersecting a direction in which the pores extend. The above-described lotus-type porous metal molded body is molded by a known method such as a pressurized gas method (for example, the method disclosed in Japanese Patent No. 4235813) or a thermal decomposition method.

Figure 2A:
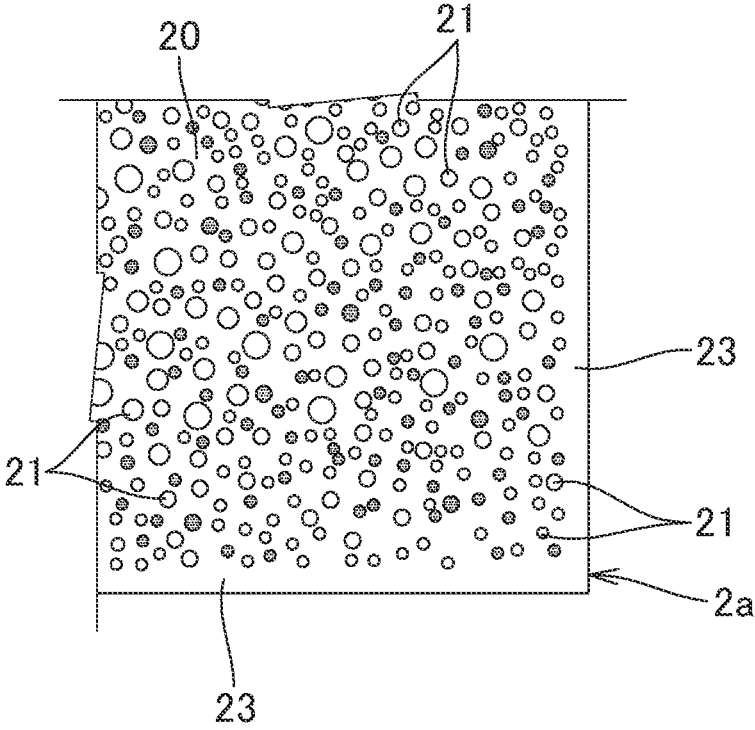
FIG. 2A is a front view showing a main part of a plate-shaped material that forms a corrugated fin.
Figure 2B:
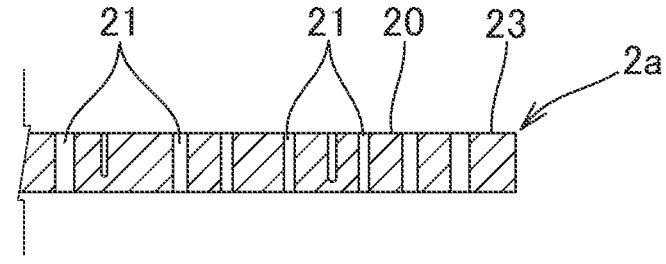
FIG. 2B is a cross-sectional view showing the plate-shaped material.

As shown in FIG. 2, the plate-shaped material 2a cut out from the lotus-type porous metal molded body as described above is provided with through holes formed by the pores. In other words, a plurality of through holes 21, which are opened in the plate surface of the plate-shaped material 2a and extend in the thickness direction of the plate-shaped material 2a, are formed on the plate-shaped material 2a.

Furthermore, a skin region 23 in which the pores are not provided is formed at a peripheral edge of the plate-shaped material 2*a* by an inner wall of a mold used for molding.

Then, each of the corrugated metal fins 2 that is formed by a continuous body of semicircular mountain-shaped portions 24 and semicircular valley-shaped portions 25, and is provided with a plurality of through holes 21 opened in the plate surface 20 of the corrugated fin 2 is formed by pressing the plate material 2*a*, for example. The corrugated fins 2 are provided between the heat absorbing portions 3 and 4 and the fluid is supplied from the fluid flow path 5 toward the plate surface 20 of the corrugated fin 2. With this configuration, even when a cross-sectional area of the fluid flow path 5 is restricted, the cooling performance of the heat sink can be improved while restraining the pressure loss of the cooling fluid.

The corrugated fin 2 formed by a continuous body of the semicircular mountain-shaped portions 24 and the semicircular valley-shaped portions 25 may be used. In this case, when a diameter of each of the mountain-shaped portion 24 and the valley-shaped portion 25 is D as shown in FIG. 3, their circumferential lengths S are expressed as nD/2 (=1.57D). Accordingly, a total perimeter of the corrugated fin 2 per the same cross-sectional area of a flow path, i.e., the perimeter from one end of the cross section of the flow path to the other end is approximately 57% longer than that of a plate-shaped fin. Accordingly, a contact area between the corrugated fins 2 and the cooling fluid is expanded. In an illustrated example, a part of the corrugated fin 2, which protrudes in a direction along the fluid flow is defined as the mountain-shaped portion 24, and a part recessed in a direction opposite to the fluid flow is defined as the valley-shaped portion 25.

As described above, if the number of through holes 21 provided in the fluid flow path 5 increases according to the increase of the contact area of the corrugated fins 2 with the cooling fluid, it is possible to efficiently radiate heat into the fluid passing through the through holes 21, and at the same time the flow rate of the fluid passing through each through hole 21 is prevented to increase, making it possible to restrain the pressure loss of the fluid. Therefore, the cooling performance of the heat sink can be sufficiently exhibited without providing a powerful fan, and the increase in power consumption and the noise generation can also be avoided.

It should be noted that a corrugated fin having a cross-sectional shape curved in a sine curve shape, a continuous body of oblong mountain-shaped portions and oblong valley-shaped portions, or a continuous body of triangular mountain-shaped portions and triangular valley-shaped portions may be used instead of the corrugated fin 2 having the continuous body of the semicircular mountain-shaped portions 24 and the semicircular valley-shaped portions 25.

Moreover, instead of the above-described typical embodiment in which each through hole 21 is formed to extend in the thickness direction of the corrugated fin 2, it is also possible to adopt a structure in which a plurality of through holes are provided which are inclined at a constant angle with respect to the thickness direction of the corrugated fin 2. However, when the plurality of through holes 21 are formed to extend in the thickness direction of the corrugated fin 2 as described in the typical embodiment, the cooling fluid can flow evenly and smoothly along each through hole 21. As a result, flow resistance of the cooling fluid passing through each through hole 21 can be reduced, the pressure loss can be reduced, and heat can be efficiently radiated into the fluid.

In the above typical embodiment, a plurality of corrugated fins 2 are arranged at intervals with their plate surfaces facing each other, and the cooling fluid is sequentially supplied toward the plate surface 20 of each corrugated fin 2 to flow along the through holes 21 in each plate surface 20. With this configuration, the heat transmitted from the heat absorbing portion 3 to each corrugated fin 2 is sequentially radiated into the fluid passing through the through holes 21 of each corrugated fin 2, and is cooled in stages. Accordingly, sufficient cooling performance of the heat sink can be ensured without taking measures such as increasing the width dimension (installation height) of the corrugated fins 2, or the like. Therefore, the heat sink can be installed even in a place where a space is small, and the heat sink structure can be made thinner and more compact than conventional heat sink structures.

Figure 3:
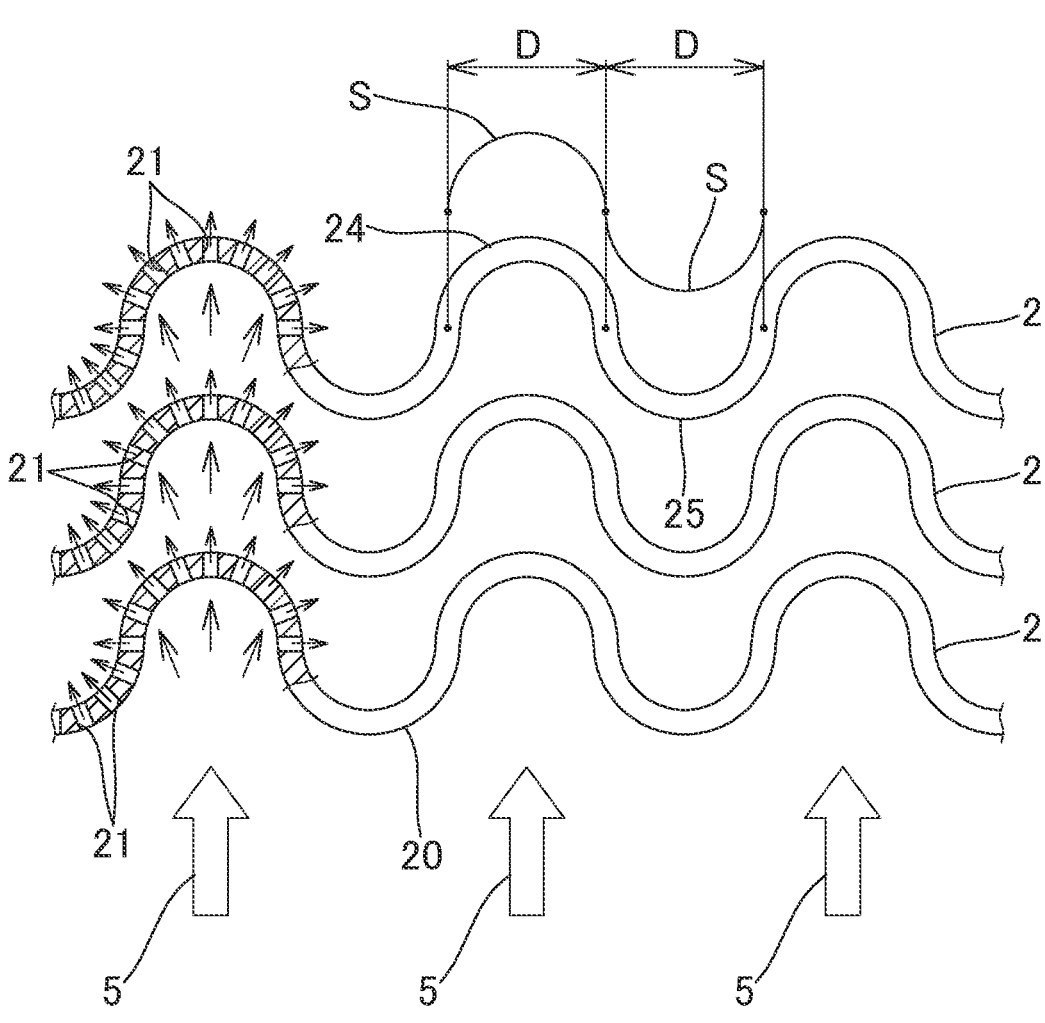
FIG. 3 is a partial cross-sectional view showing a flow state of cooling fluid.

Furthermore, as described in the above typical embodiment, when a plurality of corrugated fins 2 are arranged in parallel at a regular interval, i.e., the mountain-shaped portions 24 and the valley-shaped portions 25 of the adjacent corrugated fins 2 are arranged to face in the same direction as shown in FIG. 3, the corrugated fins 2 can be arranged at an appropriate interval while preventing the mountain-shaped portions 24 and the valley-shaped portions 25 of the adjacent corrugated fins 2 from coming into contact with each other.

Furthermore, in the above typical embodiment, the corrugated fins 2 are formed by: cutting a lotus-type porous metal molded body that has been molded through the metal solidification method and has a plurality of pores that extend in one direction, in a direction crossing the direction along which the pores extend, to form the plate-shaped material 2*a*; and then bending the plate-shaped material 2*a* into a corrugated shape. Accordingly, the corrugated fins 2 can be manufactured more easily at a lower cost, in comparison with a case where the plurality of through holes are subjected to machining through a drilling, and the like. In addition, the skin region 23 is formed around the corrugated fins 2 as described above. Accordingly, a bonding area between the heat absorbing portions 3 and 4 and each corrugated fin 2 is secured, thereby maintaining sufficient bonding strength, and transmitting heat efficiently from the heat absorbing portions 3 and 4 to the corrugated fins 2.

Figure 4:
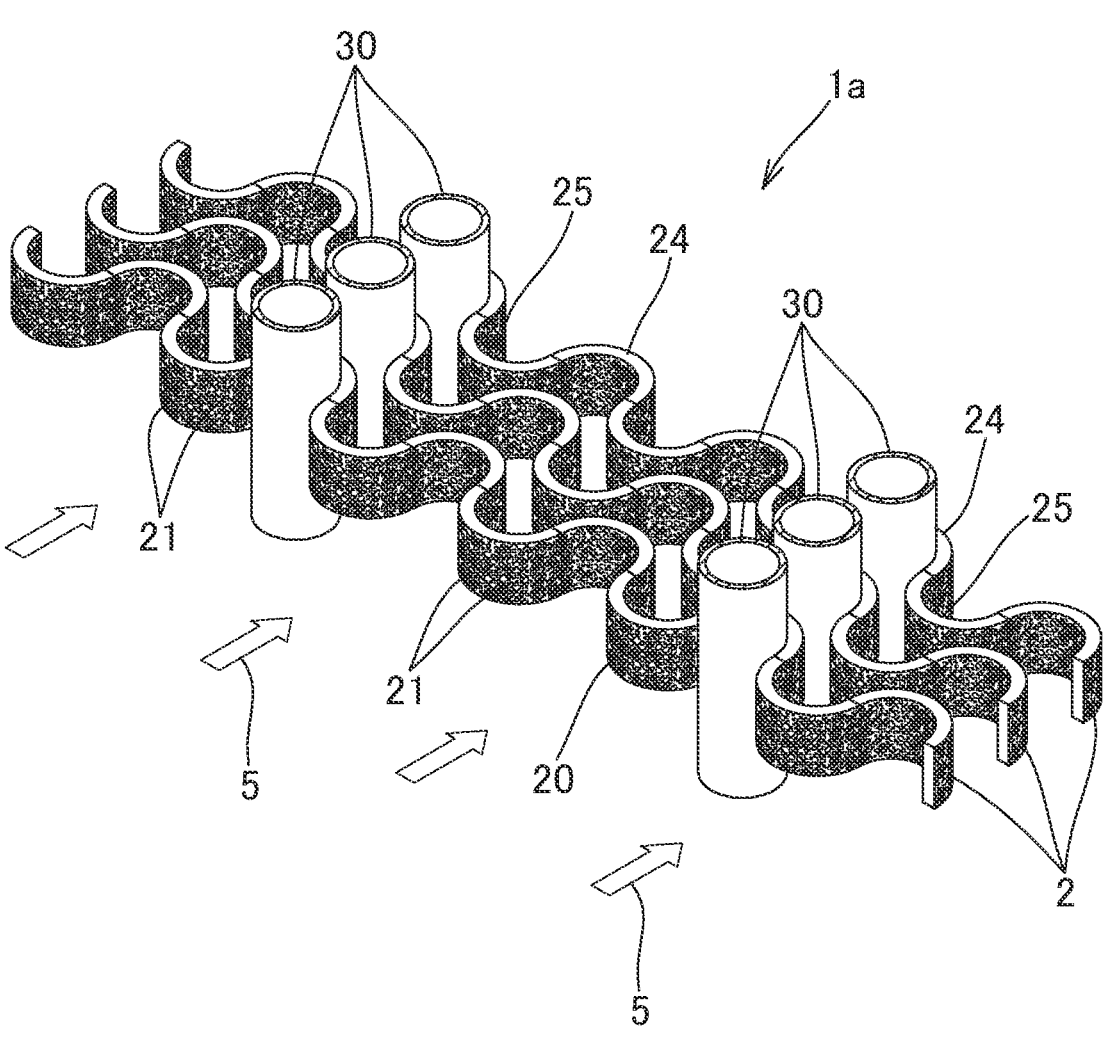
FIG. 4 is a perspective view showing a main part of a modified example of the heat sink structure according to the present invention.

A modified example of the heat sink structure according to the present invention is shown in FIG. 4. A heat sink structure 1*a* according to the modified example includes a heat absorbing portion and a plurality of corrugated fins 2. The heat absorbing portion includes a heat pipe 30 configured to vacuum-seal operation fluid in a copper tube and generate convection according to a temperature difference between the opposite ends of the copper tube to circulate the operation fluid to thereby transmit heat. Each of the plurality of corrugated fins 2 formed by a continuous body of semicircular mountain-shaped portions 24 and semicircular valley-shaped portions 25, each of which has a radius of curvature corresponding to the heat pipe 30.

The corrugated fins 2 are arranged in parallel at an interval that corresponds to a diameter of the heat pipe 30, and the heat pipe 30 is disposed between the corrugated fins 2 that face each other. A half-peripheral part of the heat pipe 30, which is one side of the heat pipe 30, is joined to an inner peripheral surface of the mountain-shaped portion 24, and the other side of the heat pipe 30 is joined to an outer peripheral surface of the valley-shaped portion 25. With this configuration, heat of the operation fluid moving inside the heat pipe 30 is transmitted from the heat pipe 30 to the corrugated fins 2. Furthermore, the fluid transferred through the fluid flow path 5 is sequentially supplied toward the plate surface 20 of each corrugated fin 2, the fluid flows along the through holes 21 of each corrugated fin 2, and the heat of the corrugated fins 2 is radiated into the fluid, thereby exerting the cooling effect of the heat sink.

As described above, each corrugated fin 2 is formed by the continuous body of a circular mountain-shaped portion 24 and a semicircular valley-shaped portion 25, and the radius of curvature of each of the mountain-shaped portion 24 and the valley-shaped portion 25 is set to a value corresponding to the heat pipe 30. In such a case, the heat pipe 30 and the corrugated fin 2 can be firmly joined by brazing or the like, with a peripheral surface of the heat pipe 30 being closely aligned with the inner peripheral surface of the mountain-shaped portion 24, and the heat can be efficiently transmitted from the heat pipe 30 to the corrugated fins 2.

Figure 5:
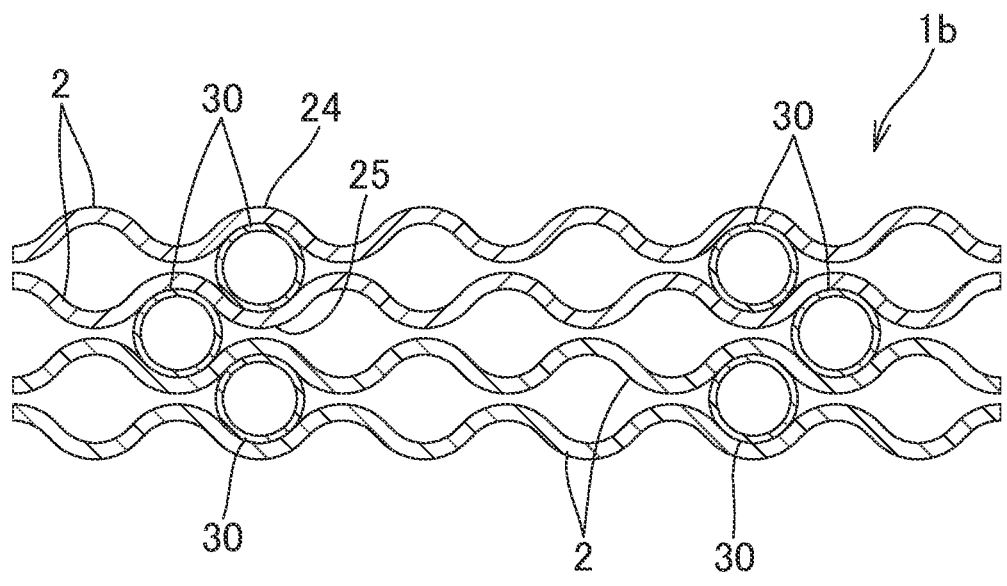
FIG. 5 is a cross-sectional view showing another modified example of the heat sink structure according to the present invention.

Instead of the above described modified example in which the half peripheral part of the heat pipe 30, which is located on one side of the heat pipe 30, is joined along the inner peripheral surface of the mountain-shaped portion 24, and the other side of the heat pipe 30 is joined to the outer peripheral surface of the valley-shaped portion 25, as shown in FIG. 4, the mountain-shaped portion 24 and valley-shaped portion 25 respectively provided in a pair of adjacent corrugated fins 2 may be arranged so as to face each other, and the heat pipe 30 may be disposed and joined between the mountain-shaped portion 24 and the valley-shaped portion 25, as shown in FIG. 5. According to a heat sink structure 1*b* configured in this way, a contact area between the heat pipe 30 and the corrugated fins 2 can be increased, and the heat pipe 30 and the corrugated fins 2 can be more firmly joined. In addition, heat can be transmitted from the heat pipe 30 to the corrugated fins 2 more efficiently.

Figure 6:
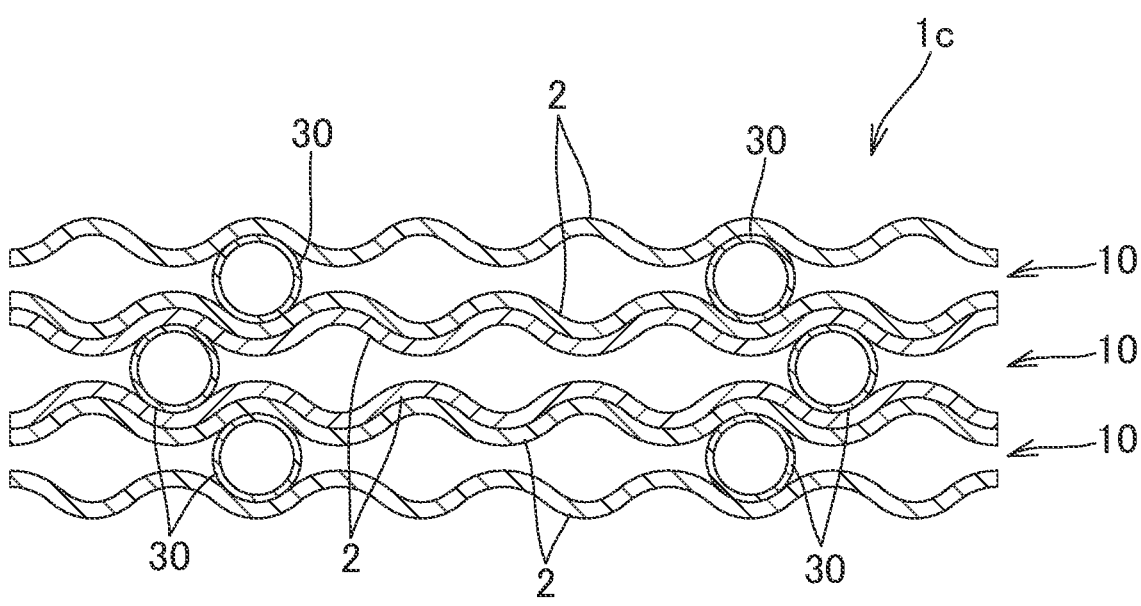
FIG. 6 is a cross-sectional view showing still another modified example of the heat sink structure according to the present invention.

Furthermore, as shown in FIG. 6, a mountain-shaped portion 24 and a valley-shaped portion 25 respectively provided in a pair of adjacent corrugated fins 2 may be arranged so as to face each other, and a heat pipe 30 may be placed and joined between the mountain-shaped portion 24 and the valley-shaped portion 25, to prepare a heat sink unit 10 in plural numbers, and the heat sink units 10 may be stacked one on top of the other. According to a heat sink structure 1*c* configured in this way, the number of corrugated fins 2 can be easily increased as needed, and the amount of heat radiated into the fluid flowing along the through holes 21 of each corrugated fin 2 can be significantly increased.

Although the embodiments of the present invention have been described above, the present invention is not limited to these embodiments. The present invention can be implemented in various forms without departing from the gist of the present invention, such as a water-cooled/liquid-cooled system in which cooling fluid made of a coolant is circulated.

REFERENCE SIGNS LIST

1 heat sink structure
2 corrugated fin

2*a* plate-shaped material
3, 4 heat absorbing portion
5 fluid flow path
10 heat sink unit
8 electronic board
9 cooling target object
20 plate surface
21 through hole
23 skin region
24 mountain-shaped portion
25 valley-shaped portion
30 heat pipe

The invention claimed is:

1. A heat sink structure comprising:
a plurality of corrugated fins that are made of metal, each of the corrugated fins having a cross section in a wave form and a plate surface in which a plurality of through holes are opened;
a heat absorbing portion that absorbs heat from a cooling target object and transmits the heat to the corrugated fin; and
a fluid flow path that allows cooling fluid to be supplied toward the plate surface of the corrugated fin and allows the cooling fluid to flow along the holes, wherein:
the corrugated fin is formed by a continuous body of a mountain-shaped portion with a semicircular cross section and a valley-shaped portion with a semicircular cross section,
the heat absorbing portion is a heat pipe,
each of the mountain-shaped portion and the valley-shaped portion has a radius of curvature corresponding to the heat pipe, and
the heat pipe is joined along an inner peripheral surface of at least one of the mountain-shaped portion and the valley-shaped portion,
the plurality of corrugated fins are arranged at an interval with plate surfaces of the respective corrugated fins facing each other,
the heat pipe is sandwiched between the plate surfaces,
the cooling fluid is sequentially supplied toward the plate surface of each of the corrugated fins, and
the heat transmitted from the heat absorbing portion to the corrugated fin is radiated into the cooling fluid passing through the through holes.

2. The heat sink structure according to claim 1, wherein the plurality of through holes extend in a thickness direction of the corrugated fin.

3. The heat sink structure according to claim 1, wherein the corrugated fin is a bent product of a cut piece of a lotus-type porous metal molded body molded through a metal solidification method, the lotus-type porous metal molded body having a plurality of pores that extend in one direction.

\* \* \* \* \*